(12) United States Patent
Fukazawa

(10) Patent No.: US 6,259,387 B1
(45) Date of Patent: Jul. 10, 2001

(54) SERIAL-PARALLEL CONVERTER CIRCUIT

(75) Inventor: Masaya Fukazawa, Kanagawa (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/507,045

(22) Filed: Feb. 22, 2000

(30) Foreign Application Priority Data

Feb. 22, 1999 (JP) ................................................ 11-043188

(51) Int. Cl.[7] .................................................. H03M 9/00
(52) U.S. Cl. ........................................... 341/100; 341/101
(58) Field of Search .................................... 341/100, 112, 341/143, 159, 160, 161, 162, 116, 165, 101; 395/800, 500

(56) References Cited

U.S. PATENT DOCUMENTS

| 5,223,833 | * | 6/1993 | Akata ................................ 341/100 |
| 5,321,400 | * | 6/1994 | Sasaki et al. ...................... 341/100 |
| 5,426,784 | * | 6/1995 | Kawata et al. .................... 395/800 |
| 5,805,088 | * | 9/1998 | Butter et al. ...................... 341/100 |
| 5,862,367 | * | 1/1999 | Chiao-Yen ......................... 395/500 |

FOREIGN PATENT DOCUMENTS 0 220 802   5/1985  (EP) .
0 813 153  12/1997  (EP) .

* cited by examiner

Primary Examiner—Brian Young
Assistant Examiner—John Nguyen
(74) Attorney, Agent, or Firm—Young & Thompson

(57) ABSTRACT

A serial-parallel converter which includes a plurality of data extraction units for sequentially extracting different bit values of serial data, which are sequentially inputted, for individually holding the different bit values for a time period corresponding to the same number of cycles of a clock signal as the number of the data extraction units until the plurality of data extraction units extract next bit values of the serial data; a delay unit connected to the plurality of data extraction units for receiving the data signals from the plurality of data extraction units and delaying the data signals to generate delay signals which synchronize with each other; and a parallel register connected to the delay unit for receiving the delay signals from the delay unit for latching the delay signals to output the delay signals simultaneously as parallel data.

11 Claims, 5 Drawing Sheets

SERIAL-PARALLEL CONVERTER CIRCUIT

BACKGROUND OF THE INVENTION

The present invention relates to a serial-parallel converter circuit for converting serial data which have been inputted time-sequentially into parallel data, and more particularly to a serial-parallel converter circuit capable of relaxing a timing-restriction in high speed operation.

A conventional serial-parallel converter circuit is disclosed in Japanese laid-open patent publication No. 4-38017. FIG. 1 is a diagram illustrative of the conventional serial-parallel converter circuit. The conventional serial-parallel converter circuit comprises a shift resistor 10 for generating latch timing, a flip-flop group 12 of flip-flop circuits 121, 122, 123 and 124, a transit resistor 14, and an output-stage resistor 16. The shift resistor 10 receives a clock signal CLK and a signal LOAD, so that the conventional serial-parallel converter circuit converts the serial data DIN into parallel data D01, D02, D03 and D04 which have plural bits.

The shift resistor 10 for generating the latch timing is connected to an OR-gate 18. The shift resistor 10 receives a clock signal CLK and a signal LOAD, so that the shift resistor 10 outputs four latch signals L1, L2, L3 and L4 in pulse form which are different in phase by one-cycle of the clock. The number of the outputted latch signals L1, L2, L3 and L4 corresponds to the number of the bits of the parallel data or four bits.

The flip-flop group 12 comprises the four flip-flip circuits 121, 122, 123, and 124 which are connected to the shift resistor 10, so that the first flip-flop 121 receives the first latch signal Li, the second flip-flop 122 receives the second latch signal L2, the third flip-flop 123 receives the third latch signal L3, and the fourth flip-flop 124 receives the fourth latch signal L4. Each of the four flip-flip circuits 121, 122, 123, and 124 receives a time-sequential input of the serial data DIN, so that each of the four flip-flip circuits 121, 122, 123, and 124 latches the serial data DIN on the basis of the latch signal L1, L2, L3 or L4 as the clock.

The transit resistor 14 is connected to the first and second flip-flops 121 and 122 for receiving output data DT01 and DT02 from the first and second flip-flops 121 and 122 respectively, so that the transit resistor 14 latches the output data DT01 and DT02. The transit resistor 14 is also connected to the shift resistor 10 for receiving the third latch signal L3 from the shift resistor 10, so that the transit resistor 14 latches the output data DT01 and DT02 on the basis of the third latch signal L3 as a clock.

The output stage resistor 16 is connected to the transit resistor 14 for receiving output data DT11 and DT12 from the transit resistor 14. The output stage resistor 16 is connected to the third and fourth flip-flops 123 and 124 for receiving the third and fourth output data DT13 and DT14 from the third and fourth flip-flops 123 and 124 respectively. The output stage resistor 16 is also connected to the shift resistor 10 for receiving the second latch signal L2 from the shift resistor 10, so that the output stage resistor 16 performs to latch the output data DT11, DT12, DT13 and DT14 on the basis of the second latch signal L2 as a clock signal, whereby the output stage resistor 16 outputs parallel data D01, D02, D03 and D04.

FIG. 2 is a timing chart illustrative of waveforms of various signals of the conventional serial-parallel converter circuit of FIG. 1. During when serial data signals DIN are inputted into the flip-flop group 12 in synchronizing with the external clock signal CLK, the first to fourth latch signals L1, L2, L3 and L4 are transmitted from the shift resistor 10 to the flip-flop group 12 as clocks, so that the first to fourth output signals DT01, DT02, DT13, and DT14 are sequentially outputted from the first to fourth flip-flops 121, 122, 123 and 124 respectively.

Subsequently, the output signals DT01 and DT02 from the first and second flip flops 121 and 122 are transmitted to the transit resistor 14 and latched by the same on the basis of the third latch signal L3 as a clock, so that the first and second output signals DT11 and DT12 are outputted from the transit resistor 14.

The output signals DT11 and DT12 from the transit resistor 14 are transmitted to the output stage resistor 16. Further, the output signals DT13 and DT14 from the third and fourth flip-flops 123 and 124 are transmitted to the output stage resistor 16. The output signals DT11 and DT12 and the output signals DT13 and DT14 are latched by the output stage resistor 16 on the basis of the second latch signal L2 from the shift resistor 10, whereby parallel data D01, D02, D03, and D04 are outputted from the output stage resistor 16.

Only the shift resistor 10 is required to show the high speed operation. Other circuits such as the flip-flop group 12 are allowed to operate in the timing of 8-divided cycle of the input clock signals. The above conventional serial-parallel converter circuit is suitable for the high speed operations.

As can be understood from FIG. 2, the above conventional serial-parallel converter circuit has a disadvantage in that there is restricted a time until the second latch signal L2 is inputted into the output stage resistor 16 after the output data DT13 and DT14 are outputted from the transit resistor 14 and the output data are outputted from the third and fourth flip-flops 123 and 124. This time restriction means that a set-up time as a timing between input data and clock is restricted.

For example, only 2-divided cycle of the input clock CLK or a time period from t2 to t3 corresponds to the set-up time for the output stage resistor 16. The increase in frequency of the clock signals CLK in order to realize or improve the high speed performance shortens one cycle time of the clock signal CLK whereby the set-up time is also shortened. This makes it difficult to ensure a sufficient set-up time.

In the above circumstances, it had been required to develop a novel serial-parallel converter circuit free from the above problem.

SUMMARY OF THE INVENTION

Accordingly, it is an object of the present invention to provide a novel serial-parallel converter circuit free from the above problems.

It is a further object of the present invention to provide a novel serial-parallel converter circuit capable of ensuring a sufficient set-up time even when a clock signal frequency is high.

The present invention provides a serial-parallel converter which comprises: a plurality of data extraction units for sequentially extracting different bit values of serial data, which are sequentially inputted, for individually holding the different bit values for a time period corresponding to the same number of cycles of a clock signal as the number of the data extraction units until the plurality of data extraction units extract next bit values of the serial data; a delay unit connected to the plurality of data extraction units for receiving the data signals from the plurality of data extraction units and delaying the data signals to generate delay signals which synchronize with each other; and a parallel register connected to the delay unit for receiving the delay signals from the delay unit for latching the delay signals to output the delay signals simultaneously as parallel data.

The above and other objects, features and advantages of the present invention will be apparent from the following descriptions.

BRIEF DESCRIPTION OF THE DRAWINGS

Preferred embodiments according to the present invention will be described in detail with reference to the accompanying drawings.

DISCLOSURE OF THE INVENTION

Figure 1:
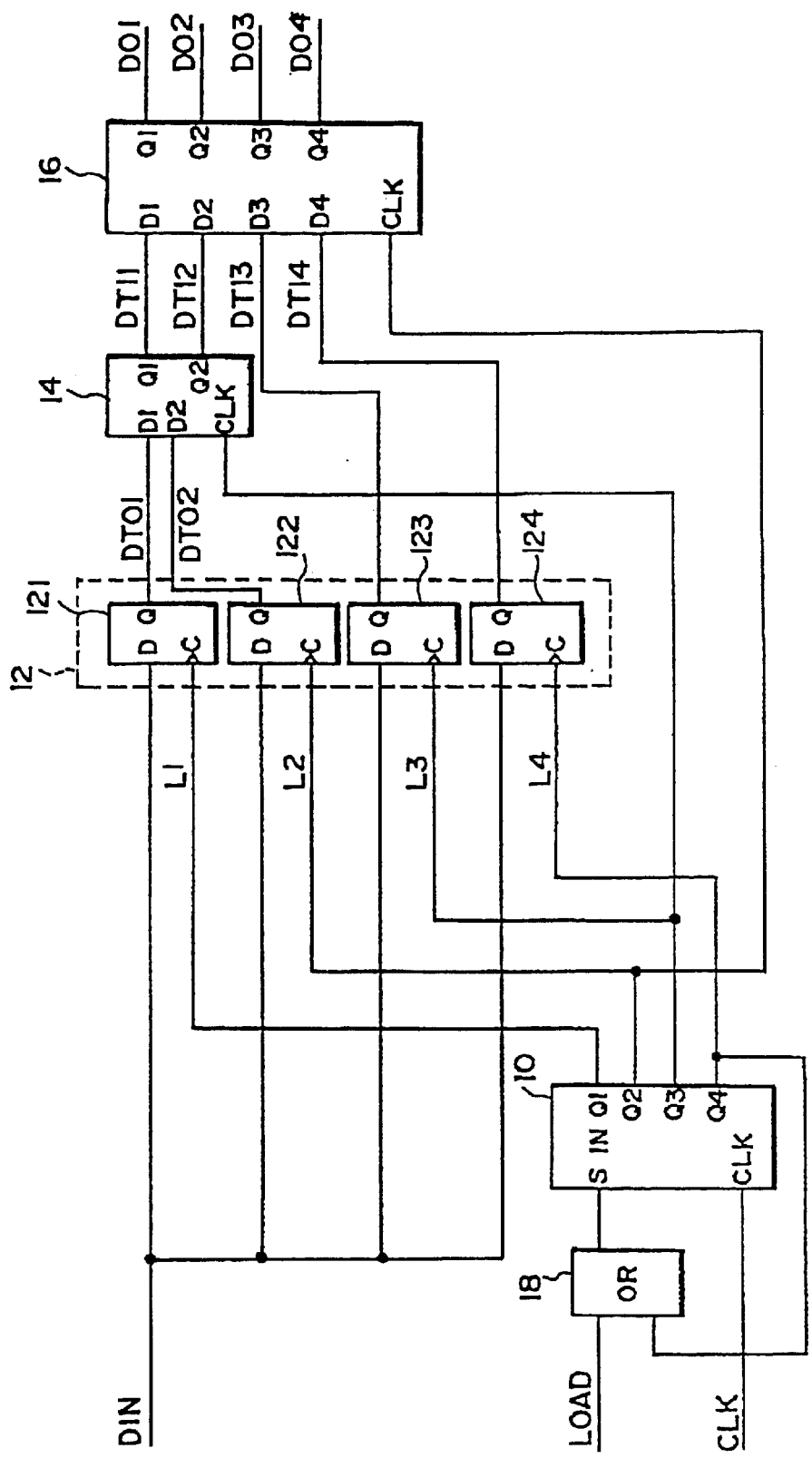
FIG. 1 is a diagram illustrative of the conventional serial-parallel converter circuit.
Figure 2:
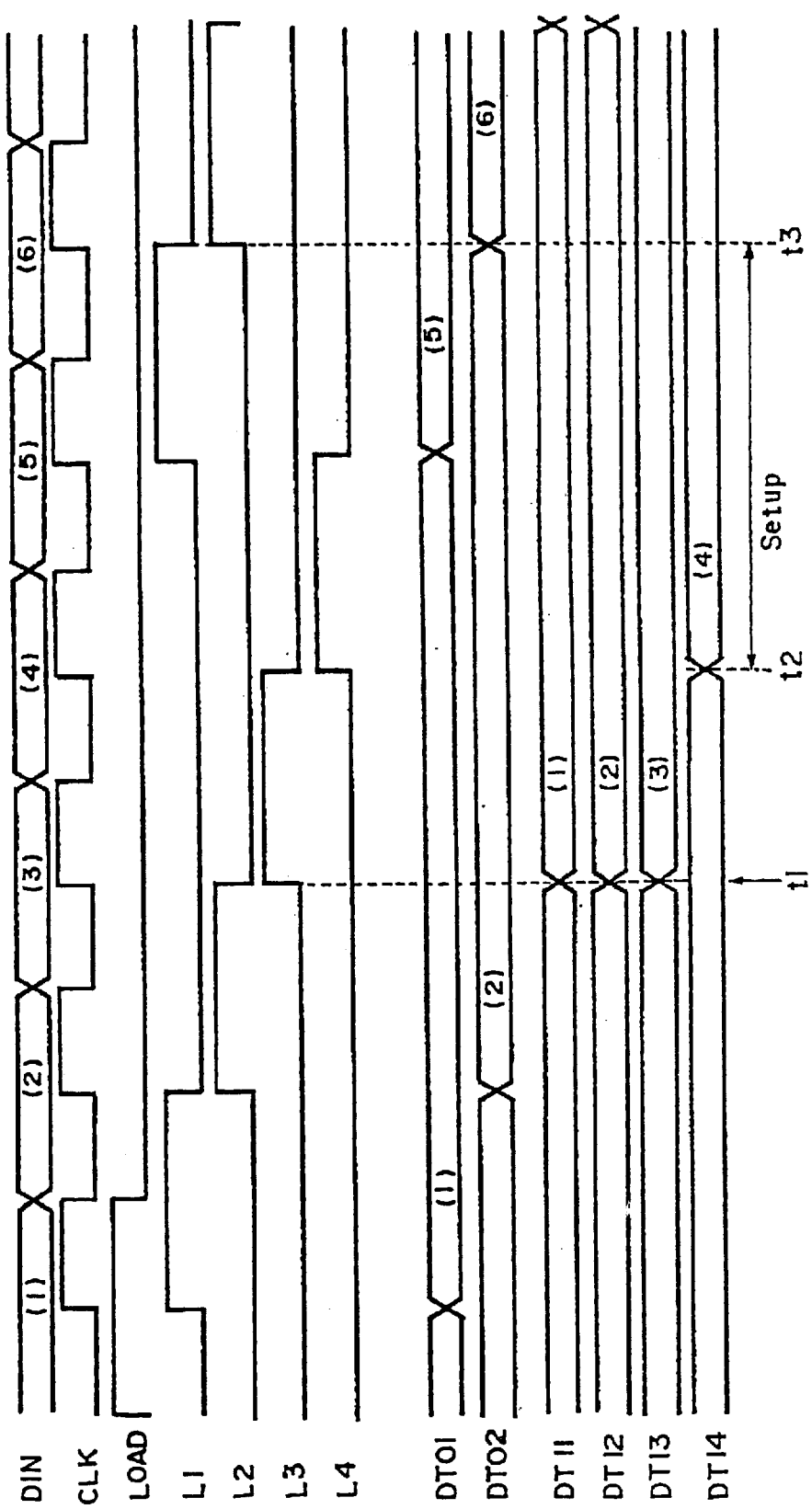
FIG. 2 is a timing chart illustrative of waveforms of various signals of the conventional serial-parallel converter circuit of FIG. 1.

The present invention provides a serial-parallel converter which comprises: a plurality of data extraction units for sequentially extracting different bit values of serial data, which are sequentially inputted, for individually holding the different bit values for a time period corresponding to the same number of cycles of a clock signal as the number of the data extraction units until the plurality of data extraction units extract next bit values of the serial data; a delay unit connected to the plurality of data extraction units for receiving the data signals from the plurality of data extraction units and delaying the data signals to generate delay signals which synchronize with each other; and a parallel register connected to the delay unit for receiving the delay signals from the delay unit for latching the delay signals to output the delay signals simultaneously as parallel data.

In accordance with the novel serial parallel converter circuit, the plural data extraction units are individually operated to latch the bit values until the next latching operations, and further the delay unit is operated to delay the data signals of the bit values to generate the delay signals which synchronize with each other, so that the longest set-up time defined to be the time period until the delay signals are latched by the parallel resistor after the delay signals have been generated may be set to be the same number clock cycles as the number of the plural data extraction units. Namely, even if the clock frequency is extremely high, the sufficient set-up time may be set.

It is preferable that each of the plurality of data extraction units comprises: a flip-flop circuit operable in synchronizing with the clock signal; and a selector connected to the flip-flop circuit for receiving an output value from the flip-flop circuit so that the selector selects one of the output value from the flip-flop circuit and the bit value of the serial data to render selected one inputted into the flip-flop circuit.

In a time duration after the selector selects the bit value of the serial data to supply the selected bit value to the flip-flop for extraction o the bit data and until the next bit value is extracted, the selector maintains to select the output from the flip-flop. The each data extraction unit may hold the extracted bit value until the next bit value is extracted.

It is further preferable that if the selector selects the bit value of the serial data, then the selector selects the output value from the flip-flop circuit after the output value from the flip-flop circuit has been changed to the bit value.

The each data extraction unit surely holds the extracted bit value until the next bit value is extracted.

It is also preferable that the delay unit delays the data signals in synchronizing with mostly-delayed one of the data signals.

A set of the data signals extracted by the above plural extraction units is delayed on the basis of the mostly-delayed data signal in the above data signals, so that the data signals are made synchronize with each other with the minimum delay.

It is also preferable that the delay unit comprises the same number of delay blocks as the number of the plurality of data extraction units, so that the delay blocks are individually connected to the plurality of data extraction units.

It is preferable to further comprise a trigger generator connected to the plurality of data extraction units for supplying individual latch signals, which synchronizing with the clock signal, to the plurality of data extraction units, so that, on the basis of the individual latch signals as triggers, the plurality of data extraction units do sequentially extract different bit values of the serial data having sequentially inputted to the plurality of data extraction units.

It is further preferable that the trigger generator is connected to the parallel resistor for supplying a load signal to the parallel resistor, so that the parallel resistor fetches the delay signals from the delay unit on the basis of the load signal.

It is further more preferable that the trigger generator comprises:

a counter for counting the clock signal to generate binary digits and for generating timings of allowing the flip-flop circuits to fetch the serial data;

and a decoder connected to the counter for receiving the binary digits from the counter to generate the latch signals and the load signal.

It is also preferable that the trigger generator comprises a shift resistor.

Figure 3:
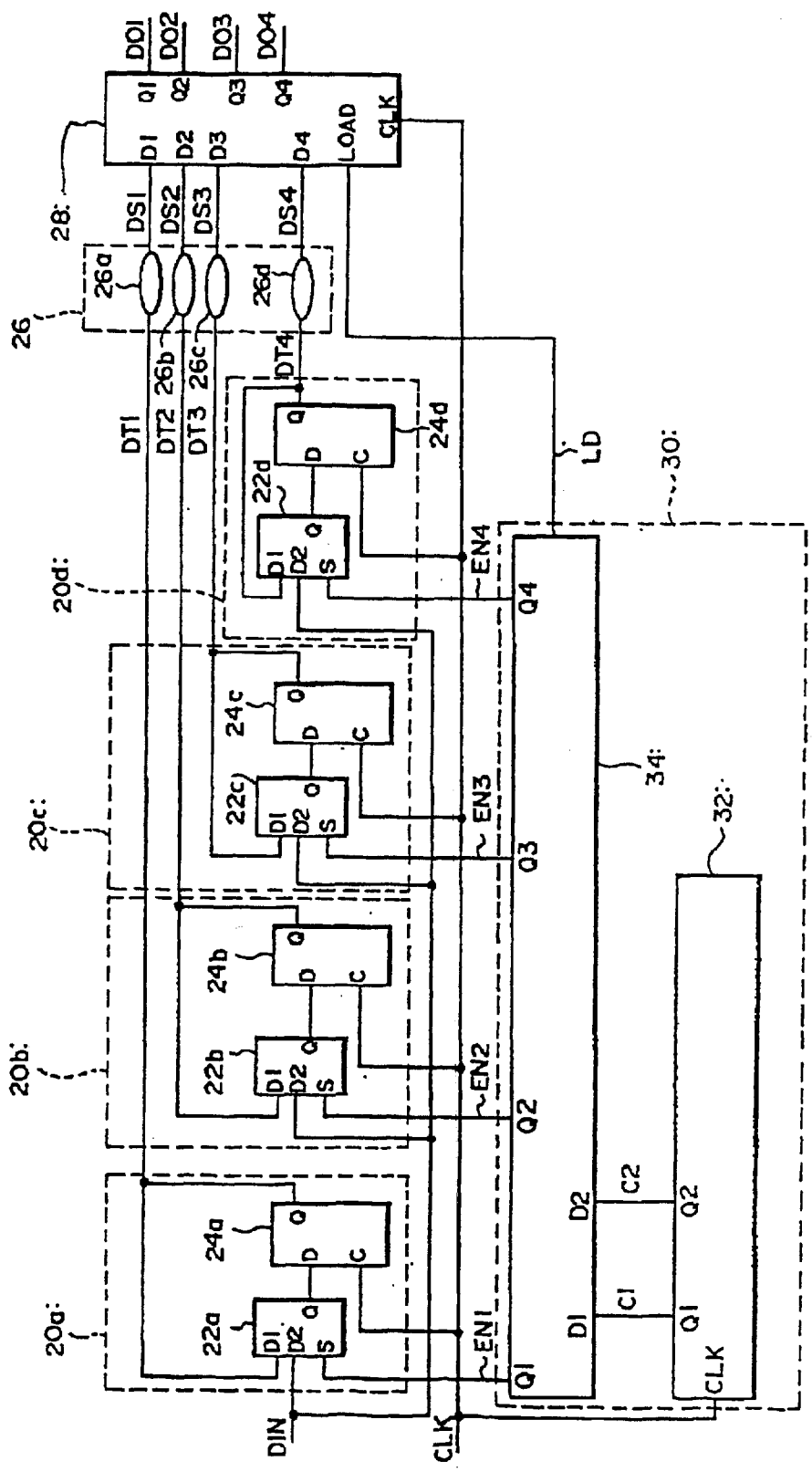
FIG. 3 is a block diagram illustrative of a novel serial-parallel converter circuit in a first embodiment in accordance with the present invention.

A first embodiment according to the present invention will be described in detail with reference to the drawings. FIG. 3 is a block diagram illustrative of a novel serial-parallel converter circuit in a first embodiment in accordance with the present invention.

The first novel serial-parallel converter circuit comprises first to fourth data extraction units 20a, 20b, 20c and 20d, a delay unit 26, a parallel register 28, and a trigger generator 30. Each of the first to fourth data extraction units 20a, 20b, 20c and 20d is connected to the delay unit 26 and also connected to the trigger generator 30. The delay unit 26 is connected to the first to fourth data extraction units 20a, 20b, 20c and 20d, and also connected to the parallel register 28. The parallel register 28 is connected to the delay unit 26 and also connected to the trigger generator 30. The first data extraction unit 20a has a first selector 22a and a first flip-flop 24a. The first selector 22a receives the serial data DIN. The first flip-flop 24a is connected to the first selector 22a for receiving an output from the first selector 22a and also receiving a clock signal CLK, so that the first flip-flop 24a outputs first output data DT1. The second data extraction unit 20b has a second selector 22b and a second flip-flop 24b. The second selector 22b receives the serial data DIN. The second flip-flop 24b is connected to the second selector 22b for receiving an output from the second selector 22b and also receiving the clock signal CLK, so that the second flip-flop 24b outputs second output data DT2. The third data extraction unit 20c has a third selector 22c and a third flip-flop 24c. The third selector 22c receives the serial data DIN. The third flip-flop 24c is connected to the third selector 22c for receiving an output from the third selector 22c and also receiving the clock signal CLK, so that the third flip-flop 24c outputs third output data DT3. The fourth data extraction unit 20d has a fourth selector 22d and a fourth flip-flop 24d. The fourth selector 22d receives the serial data DIN. The fourth flip-flop 24d is connected to the fourth selector 22d for receiving an output from the fourth selector 22d and also receiving the clock signal CLK, so that the fourth flip-flop 24d outputs fourth output data DT4. The trigger generator 30 has a counter 32 and a decoder 34 connected to the counter 32. The counter receives the clock signal CLK. The decoder 34 is connected to the first to fourth selectors 22a, 22b, 22c and 22d. The delay unit 26 has a first delay block 26a connected to the first data extraction unit 20a, a second delay block 26b connected to the second data extraction unit 20b, a third delay block 26c connected to the third data extraction unit 20c, and a fourth delay block 26d connected to the fourth data extraction unit 20c.

Each of the first to fourth data extraction units 20a, 20b, 20c, and 20d performs sequential extraction operations of sequentially extracting bit values of bits different from each other of the serial data DIN which have inputted to the fourth data extraction units 20a, 20b, 20c, and 20d in synchronizing with the clock signal CLK. Each of the first to fourth data extraction units 20a, 20b, 20c, and 20d extracts the different bit value of the serial data DIN for every four cycles of the clock signals to hold or latch the extracted bit values for the four clock cycles until the each of the first to fourth data extraction units 20a, 20b, 20c, and 20d extracts the next bit value. Each of the first to fourth data extraction units 20a, 20b, 20c, and 20d extracts the different bit value and also outputs the previously extracted bit values having been latched for the four cycles of the clock signal. As a result, for each data signal, one bit value is held during the four clock cycles.

The first selector 22a in the first data extraction unit 20a receives the output signal DT1 from the first flip-flop 24a and the serial data DIN as well as receives a first latch signal EN1 from the decoder 34 in the trigger generator circuit 30. The first selector 22a selects any one of the output signal DT1 from the first flip-flop 24a or the bit values of the serial data DIN so as to transmit the selected one to the first flip flop 24a. If the first selector 22a has selected the bit value of the serial data DIN, then the output value DT1 from the first flip-flop 24a is changed to this bit value before the first selector 22a selects the first output value DT1 from the first flip-flop 24a.

The second selector 22b in the second data extraction unit 20b receives the output signal DT2 from the second flip-flop 24b and the serial data DIN as well as receives a second latch signal EN2 from the decoder 34 in the trigger generator circuit 30. The second selector 22b selects any one of the output signal DT2 from the second flip-flop 24b or the bit value of the serial data DIN so as to transmit the selected one to the second flip flop 24b. If the second selector 22b has selected the bit value of the serial data DIN, then the output value DT2 from the second flip-flop 24b is changed to this bit value before the second selector 22b selects the second output value DT2 from the second flip-flop 24b.

The third selector 22c in the third data extraction unit 20c receives the output signal DT3 from the third flip-flop 24c and the serial data DIN as well as receives a third latch signal EN3 from the decoder 34 in the trigger generator circuit 30. The third selector 22c selects any one of the output signal DT3 from the third flip-flop 24c or the bit value of the serial data DIN so as to transmit the selected one to the third flip flop 24c. If the third selector 22c has selected the bit value of the serial data DIN, then the output value DT3 from the third flip-flop 24c is changed to this bit value before the third selector 22c selects the third output value DT3 from the third flip-flop 24c.

The fourth selector 22d in the fourth data extraction unit 20d receives the output signal DT4 from the fourth flip-flop 24d and the serial data DIN as well as receives a fourth latch signal EN4 from the decoder 34 in the trigger generator circuit 30. The fourth selector 22d selects any one of the output signal DT4 from the fourth flip-flop 24d or the bit value of the serial data DIN so as to transmit the selected one to the fourth flip flop 24d. If the fourth selector 22c has selected the bit value of the sedal data DIN, then the output value DT4 from the fourth flip-flop 24d is changed to this bit value before the fourth selector 22d selects the fourth output value DT4 from the fourth flip-flop 24d.

The first data signal DT1 from the first data extraction unit 20a is transmitted to the first delay block 26a in the delay unit 26. The second data signal DT2 from the second data extraction unit 20b is transmitted to the second delay block 26b in the delay unit 26. The third data signal DT3 from the third data extraction unit 20c is transmitted to the third delay block 26c in the delay unit 26. The fourth data signal DT4 from the fourth data extraction unit 20d is transmitted to the fourth delay block 26d in the delay unit 26. The delay unit 26 performs individual delay operations to the first to fourth data signals DT1, DT2, DT3 and DT4, thereby to generate first to fourth delay signals DS1 to DS4 which synchronize with each other. In this embodiment, the first, second and third data signals DT1, DT2 and DT3 are delayed, wherein the first data signal DT1 is mostly delayed. The second, third and fourth data signals DT2, DT3 and DT4 synchronize with the most-delayed data signal DT1. The configuration of the first to fourth delay blocks 26a, 26b, 26c and 26d may comprise the conventional delay circuit as well known. For example, a series connection of plural buffer circuits may be applicable to each of the first to fourth delay blocks 26a, 26b, 26c and 26d. In this case, the first to fourth delay blocks 26a, 26b, 26c and 26d are different in the number of the buffer circuits so that the first to fourth delay blocks 26a, 26b, 26c and 26d perform various delays corresponding to the different numbers of the buffer circuits. The first to fourth delay blocks 26a, 26b, 26c and 26d output the first to fourth delay signals DS1, DS2, DS3 and DS4. The first to fourth delay signals DS1, DS2, DS3 and DS4 are inputted into first to fourth data input terminals D1, D2, D3 and D4 of the parallel resistor 28. The parallel resistor 28 latches the first to fourth delay signals DS1, DS2, DS3 and DS4 on the basis of the load signal LOAD from the decoder 34, so that the parallel resistor 28 outputs parallel data D01, D02, D03 and D04 concurrently.

In accordance with the novel serial-parallel converter circuit, the first to fourth data extraction units 20a, 20b, 20c and 20d individually latch the bit values until the next latching operation, and further the delay unit 26 delays the data signals of the bit values so that the delay unit 26 outputs the delay signals DS1, DS2, DS3 and DS4 which synchronize with each other. As a result, it is possible to ensure a time corresponding to the four cycles or the same number cycles as the number of the stages of the data extraction units as the set-up time which is defined from the output of the delay signals DS1, DS2, DS3 and DS4 to the latching operation of the delay signals DS1, DS2, DS3 and DS4 by the parallel register 28. Accordingly, even if the clock frequency is high, a sufficient set-up time can be ensured. The set-up time can be changed by changing the number of the extraction units. The increase in the number of the extraction units results in the increase in the set-up time.

The trigger generator 30 generates the latch signals EN1, EN2, EN3 and EN4 synchronizing with the clock signals, wherein the latch signals EN1, EN2, EN3 and EN4 serve as triggers for sequential extraction of the bit values of the serial data by the data extraction unit. The trigger generator 30 generates the load signal LOAD which serves as a trigger for allowing the parallel resistor 28 to load the delay data DS1, DS2, DS3 and DS4.

In this embodiment, the trigger generator 30 may comprise the counter 30 for counting the clock signals to generate the binary digits and also for generating the timing for allowing the serial data to be fetched into the flip-flips, and the decoder 34 for decoding the binary digits to generate the load signal LOAD and the latch signals EN1, EN2, EN3 and EN4.

The counter 32 outputs a first binary code C1 which varies for every one cycle and a second binary code C2 which varies for every two cycles. The first and second binary codes C1 and C2 are transmitted to the decoder 34, so that the decoder 34 outputs the latch signals EN1, EN2, EN3 and EN4 which instruct the timings for fetching the data into the first to fourth selectors 22a, 22b, 22c and 22d, wherein the latch signals are sequentially outputted with a stagger of one clock cycle in the order of EN4, EN3, EN2 and EN1.

The counter 32 and the decoder 34 may comprise the conventional structures.

Figure 4:
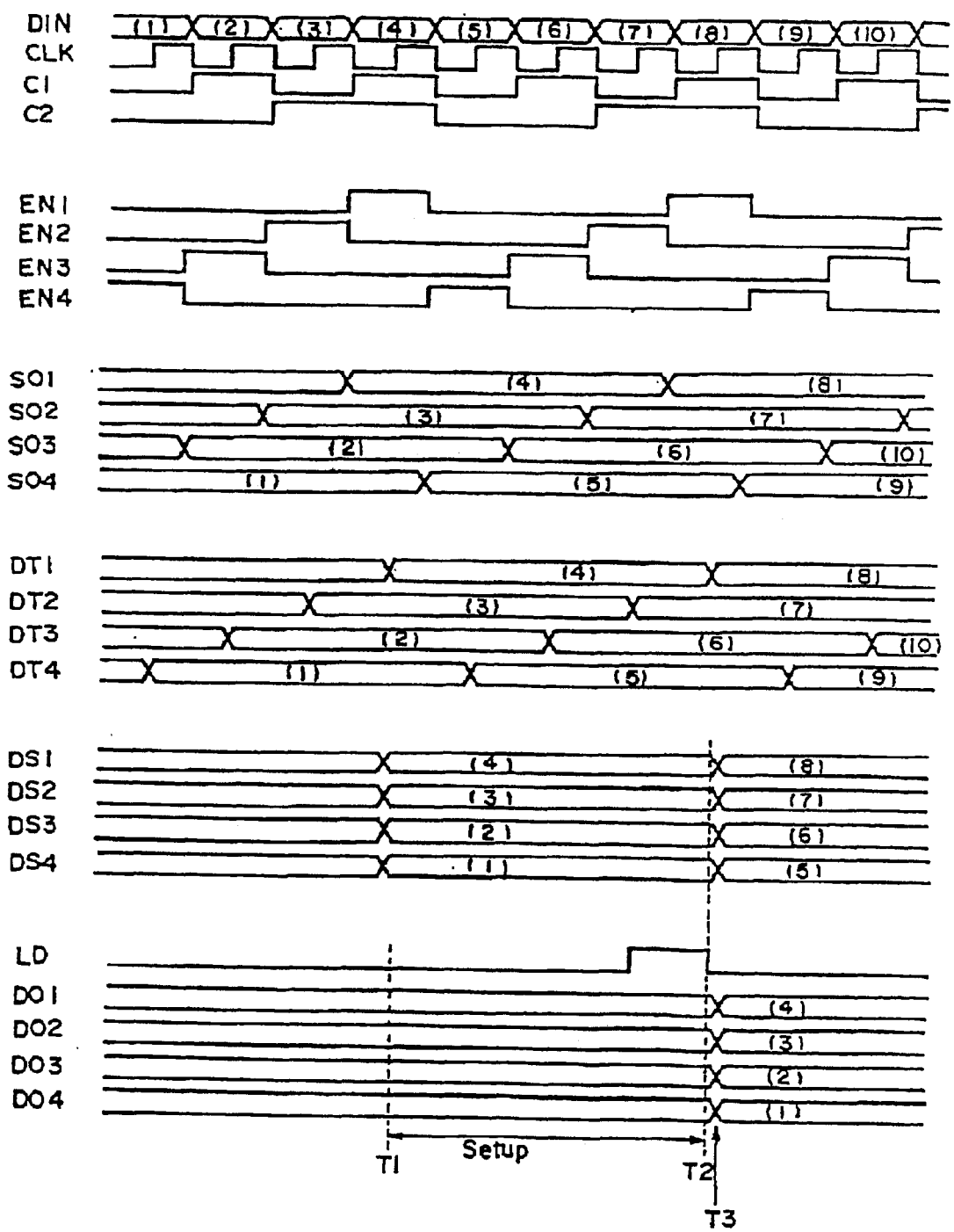
FIG. 4 is a timing chart illustrative of waveforms of signals of the above novel serial-parallel converter circuit shown in FIG. 3.

Operations of the above lovel serial-parallel converter circuit will be described. FIG. 4 is a timing chart illustrative of waveforms of signals of the above novel serial-parallel converter circuit shown in FIG. 3. The serial data DIN synchronize with the clock signal CLK and are supplied to the first to fourth selectors 22a, 22b, 22c and 22d of the first to fourth data extraction units 20a, 20b, 20c and 20d, respectively. The clock signal CLK is supplied to the first to fourth flip-flops 24a, 24b, 24c and 24d and the counter 32 as well as the parallel resistor 28, so that the above first novel converter circuit operates in accordance with the single clock signal CLK.

The first to fourth latch signals EN1, EN2, EN3 and EN4 are supplied from the decoder 34 to the first to fourth selectors 22a, 22b, 22c and 22d for instructing the timing of fetching the serial data DIN. The first to fourth latch signals EN1, EN2, EN3 and EN4 become enable with different timings by one cycle from each other, whereby each of the first to fourth latch signals EN1, EN2, EN3 and EN4 becomes enable for every four cycles with the different timings by one cycle.

The first to fourth latch signals EN1, EN2, EN3 and EN4 in the enable state are sequentially inputted into the first to fourth selectors 22a, 22b, 22c and 22d so that the first to fourth selectors 22a, 22b, 22c and 22d select the bit values of the serial data DIN upon receipt of the first to fourth latch signals EN1, EN2, EN3 and EN4 in the enable state, respectively, so that the first to fourth selectors 22a, 22b, 22c and 22d individually output the signals S1, S02, S03 and S04 sequentially which are then inputted into the first to fourth flip-flops 24a, 24b, 24c, and 24d.

After one clock cycle has passed from placing the first to fourth latch signals EN1, EN2, EN3 and EN4 into the enable state, then the first to fourth latch signals EN1, EN2, EN3 and EN4 become unable or inactivated, whereby the first to fourth selectors 22a, 22b, 22c and 22d select again the bit values of the data signals outputted from the first to fourth flip-flops 24a, 24b, 24c and 24d, so that the first to fourth selectors 22a, 22b, 22c and 22d sequentially output the selected bit values as the output signals S01, S2, S03 and S4 which are then inputted into the first to fourth flip-flops 24a, 24b, 24c and 24d.

A time difference from, what the first to fourth selectors 22a, 22b 22c and 22d select the bit values of the serial data DIN, to, what the first to fourth selectors 22a, 22b 22c and 22d again select the outputs from the first to fourth flip-flops 24a, 24b, 24c and 24d, is sufficiently shorter than the one clock cycle, for which reason the outputs from the first to fourth flip-flops 24a, 24b, 24c and 24d to be selected again by the first to fourth selectors 22a, 22b 22c and 22d are the bit values of the serial data DIN.

Accordingly, the first to fourth flip-flops 24a, 24b, 24c and 24d generate the first to fourth data signals DT1, DT2, DT3 and DT4 which correspond to the previous bit values. Each of the first to fourth data extraction units 20a, 20b, 20c and 20d respectively having the first to fourth flip-flops 24a, 24b, 24c and 24d holds the bit data for four clock cycles at the different timings and outputs individual one of the first to fourth data signals DT1, DT2, DT3 and DT4.

In this embodiment, the first to fourth latch signals EN1, EN2, EN3 and EN4 become enabled in the order of EN4, EN3, EN2 and finally EN1. Accordingly, the fourth data extraction unit 20d is first operated to extract the first bit value (1) of the serial data DIN and outputs the fourth data signal DN4. Secondly, the third data extraction unit 20c is operated to extract the second bit value (2) of the serial data DIN and outputs the third data signal DN3. Thirdly, the second data extraction unit 20b is operated to extract the third bit value (3) of the serial data DIN and outputs the second data signal DN2. Fourthly, the first data extraction unit 20a is operated to extract the fourth bit value (4) of the serial data DIN and outputs the first data signal DN1. The above extraction operations by the fourth to first data extraction units 20d, 20c, 20b and 20a will be repeated.

The individual data signals DT1, DT2, DT3 and DT4 have been outputted from the first to fourth data extraction units 20a, 20b, 20c and 20d sequentially in the different timings by one clock cycle, and then are inputted into the first to fourth delay blocks 26a, 26b, 26c and 26d of the delay unit 26. The first to fourth data signals DT1, DT2, DT3 and DT4 are adjusted in timing so that the first to fourth delay signals DS1, DS2, DS3 and DS4 are simultaneously outputted from the first to fourth delay blocks 26a, 26b, 26c and 26d at the time T1.

The first delay block 26a delays the first data signal DT1 with the three clock cycles to generate the first delay signal DS1. The second delay block 26b delays the second data signal DT2 with the two clock cycles to generate the second delay signal DS2. The third delay block 26c delays the third data signal DT3 with the one clock cycle to generate the third delay signal DS3. The fourth delay block 26d does not delay the fourth data signal DT4 to generate the fourth delay signal DS4. As a result, the first to fourth delay signals DS1, DS2, DS3 and DS4 synchronize with each other by the minimum delay time.

Whereas in this embodiment the delay time of the fourth data signal DT4 by the fourth delay block 26d is zero, how long the data signals are delayed should not be limited to the above, provided that the difference in delay time among the above first to fourth data signals according to the above.

The individual first to fourth delay signals DS1, DS2, DS3 and DS4 are individually inputted to the first to fourth input stages D1, D2, D3 and D4 of the parallel resistor 28. The parallel resistor 28 receives inputs of the clock signal CLK and the load signal LOAD from the decoder 34 in addition to the inputs of the first to fourth delay signals DS1, DS2, DS3 and DS4. The parallel resistor 28 is operated to open the input stages D1, D2, D3 and D4 at the time T2 on the basis of the load signal LOAD for fetching the first to fourth delay signals DS1, DS2, DS3 and DS4. Subsequently, the parallel resistor 28 is operated to latch the first to fourth delay signals DS1, DS2, DS3 and DS4 on the basis of the clock signal CLK at the time T3 so that the parallel data D01, D02, D03 and D04 are simultaneously outputted from the parallel resistor 28. In this embodiment, the fourth parallel data D04 have the first bit value (1). The third parallel data D03 have the second bit value (2). The second parallel data D02 have the third bit value (3). The first parallel data D01 have the fourth bit value (4).

Accordingly, the set-up time corresponds to the time until the parallel resistor 28 fetches the data at the time T3 after the first to fourth delay signals DS1, DS2, DS3 and DS4 have simultaneously been outputted at the time T2. Further, the longest set-up time is the four clock cycles, or the time period for which each of the first to fourth delay signals latch the individual bit values, whereby even if the clock frequency is high to shorten the one clock cycle, the parallel resistor 28 is allowed to latch the first to fourth delay data signals DS1, DS2, DS3 and DS4. The fifth or later bit values of the serial data DIN will be converted into the parallel data for every four bits.

In accordance with the first novel serial parallel converter circuit, the first to fourth data extraction units are individually operated to latch the bit values until the next latching operations and further delay unit is operated to delay the data signals of the bit values to generate the delay signals which synchronize with each other, so that the longest set-up time defined to be the time period until the delay signals are latched by the parallel resistor after the delay signals have been generated may be set to be the four clock cycles. Namely, even if the clock frequency is extremely high, the sufficient set-up time may be set.

In this embodiment, the latch signals and the load signal are generated by the trigger generator. It is, however, possible as a modification that the latch signals and the load signal are supplied externally.

Figure 5:
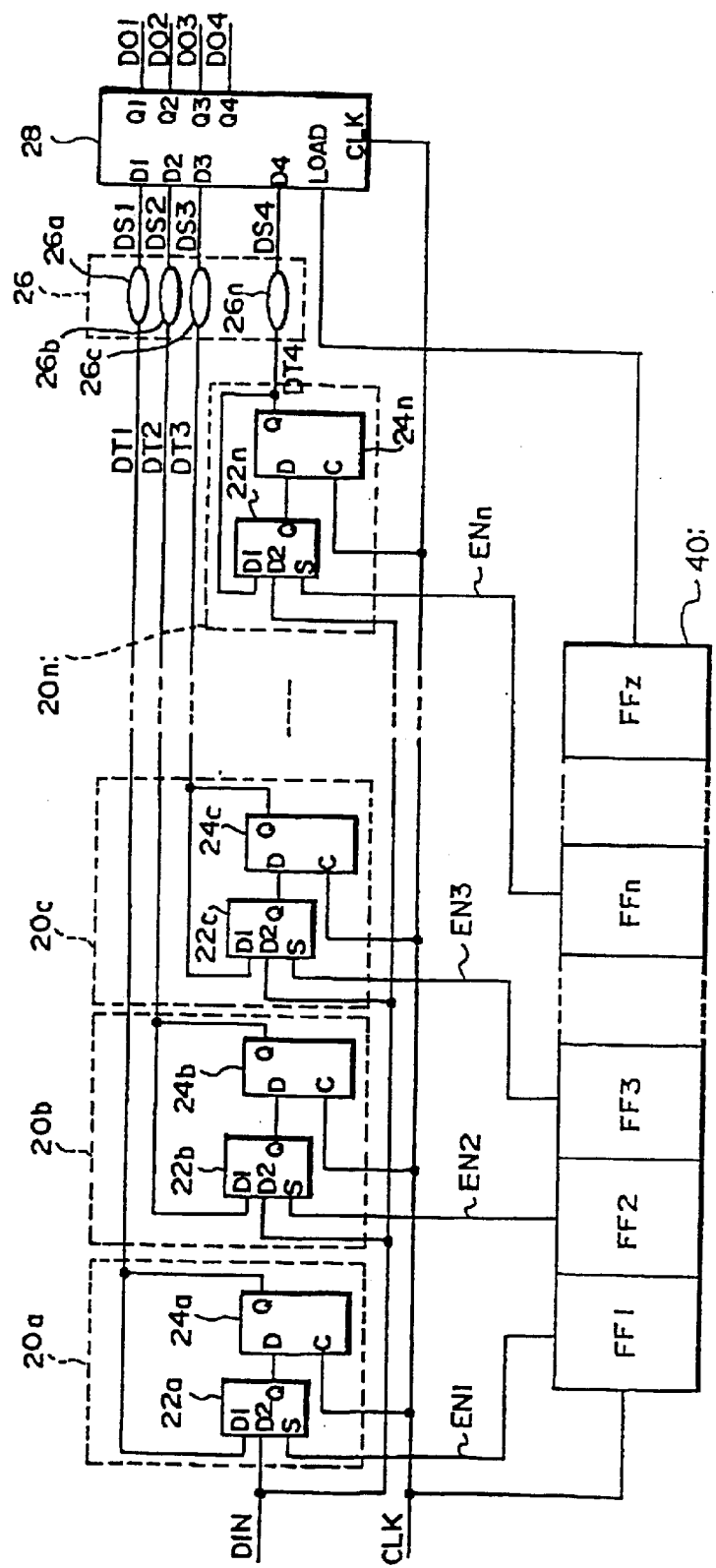
FIG. 5 is a block diagram illustrative of a novel serial-parallel converter circuit in a second embodiment in accordance with the present invention.

A second embodiment according to the present invention will be described in detail with reference to the drawings. FIG. 5 is a block diagram illustrative of a novel serial-parallel converter circuit in a second embodiment in accordance with the present invention. The following descriptions will focus only on the differences of the second novel converter circuit of this second embodiment from the first novel converter circuit of the above first embodiment, in order to prevent any duplicate descriptions.

In this embodiment, n of the data extraction units are provided, wherein n is the integer of not less than two, so that each of the data extraction units latches the bit value for n clock cycles. A set of the first to n-th bit values of the serial data DIN is converted to a set of the parallel data which are simultaneously outputted from the parallel resistor.

A shift resistor 40 is provided which serves as a trigger generator. A clock signal CLK is inputted into a first flip-flop FF1 of the shift resistor 40, so that a first latch signal EN1 is outputted from the first stage flip-flop FF1 with a delay of one clock cycle from the input of the lock signal CLK. Further, a second latch signal EN2 is outputted from a second stage flip-flop FF2 with a further delay of two clock cycles from the input of the lock signal CLK. A third latch signal EN3 is outputted from a third stage flip-flop FF3 with a further delay of three clock cycles from the input of the lock signal CLK. An n-th latch signal ENn is outputted from an n-th stage flip-flop FFn with a further delay of n clock cycles from the input of the lock signal CLK. The latch signals are outputted from the shift resistor 40 in the order of EN1, EN2, - - - ENn. The load signal LOAD is outputted from a final stage flip-flop FFz of the shifter resistor 40, and the load signal LOAD is inputted to the parallel resistor 28. It is preferable that a difference of the final stage to the n-th stage is not more than n. The serial parallel conversions are made in the same manner as in the above first embodiment except for the followings. In this embodiment, the first parallel data D01 have the first bit value (1). The second parallel data D02 have the second bit value (2). The third parallel data D03 have the third bit value (3). The fourth parallel data D04 have the fourth bit value (4). The n-th parallel data D0n have the n-th bit value (n). The (n+1)th or later bit values of the serial data DIN are also converted into the parallel data in the same manner as the conversion of the first to n-th bit values.

In accordance with the second novel serial parallel converter circuit, the first to fourth data extraction units are individually operated to latch the bit values until the next latching operations and further delay unit is operated to delay the data signals of the bit values to generate the delay signals which synchronize with each other, so that the longest set-up time defined to be the time period until the delay signals are latched by the parallel resistor after the delay signals have been generated may be set to be the four clock cycles. Namely, even if the clock frequency is extremely high, the sufficient set-up time may be set.

In this embodiment, the latch signals and the load signal are generated by the shift resistor. It is, however, possible as a modification that the latch signals and the load signal are supplied externally.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A serial-parallel converter comprising:
    a plurality of data extraction units for sequentially extracting different bit values of serial data, which are sequentially inputted, for individually holding said different bit values for a time period corresponding to the same number of cycles of a clock signal as the number of said data extraction units until said plurality of data extraction units extract next bit values of said serial data;
    a delay unit connected to said plurality of data extraction units for receiving data signals from said plurality of data extraction units and delaying said data signals to generate delay signals which synchronize with each other; and
    a parallel register connected to said delay unit for receiving said delay signals from said delay unit for latching said delay signals to output said delay signals simultaneously as parallel data.

2. The serial-parallel converter as claimed in claim 1, wherein each of said plurality of data extraction units comprises:

a flip-flop circuit operable in synchronizing with said clock signal; and a selector connected to said flip-flop circuit for receiving an output value from said flip-flop circuit so that said selector selects one of said output value from said flip-flop circuit and said bit value of said serial data to render selected one inputted into said flip-flop circuit.

3. The serial-parallel converter as claimed in claim 2, wherein if said selector selects said bit value of said serial data, then said selector selects said output value from said flip-flop circuit after said output value from said flip-flop circuit has been changed to said bit value.

4. The serial-parallel converter as claimed in claim 1, wherein said delay unit delays said data signals in synchronizing with mostly-delayed one of said data signals.

5. The serial-parallel converter as claimed in claim 1, wherein said delay unit comprises the same number of delay blocks as the number of said plurality of data extraction units, so that said delay blocks are individually connected to said plurality of data extraction units.

6. The serial-parallel converter as claimed in claim 1, further comprising a trigger generator connected to said plurality of data extraction units for supplying individual latch signals, which synchronizing with said clock signal, to said plurality of data extraction units, so that, on the basis of said individual latch signals as triggers, said plurality of data extraction units do sequentially extract different bit values of said serial data having sequentially inputted to said plurality of data extraction units.

7. The serial-parallel converter as claimed in claim 6, wherein said trigger generator is connected to said parallel resistor for supplying a load signal to said parallel resistor, so that said parallel resistor fetches said delay signals from said delay unit on the basis of said load signal.

8. The serial-parallel converter as claimed in claim 7, wherein said trigger generator comprises:

a counter for counting said clock signal to generate binary digits and for generating timings to fetch said serial data; and a decoder connected to said counter for receiving said binary digits from said counter to generate said latch signals and said load signal.

9. The serial-parallel converter as claimed in claim 7, wherein said trigger generator comprises a shift resistor.

10. A serial-parallel converter comprising:

plural data extraction units for sequentially extracting bit values of serial data sequentially input thereto and for individually holding the bit values for a time period corresponding to a number of cycles of a clock signal equal to a number of said plural data extraction units, each of said plural data extraction units comprising a flip-flop synchronously operating with the clock signal;

a delay unit connected to said plural data extraction units for receiving data signals from said plural data extraction units and delaying the data signals to generate delay signals that are synchronized with each other;

a parallel register connected to said delay unit and receiving the delay signals therefrom for latching the delay signals to output the delay signals simultaneously as parallel data; and a trigger generator connected to each of said plural data extraction units for providing individual latch signals synchronously with the clock signal to said plural data extraction units, said trigger generator also being connected to said parallel register and providing a load signal thereto so that said parallel register fetches the delay signals on the basis of the load signal, said trigger generator comprising, a counter for counting the clock signal to generate binary digits and for generating timing signals for fetching the serial data, and a decoder connected to said counter and receiving the binary digits to generate the latch signals and the load signal.

11. A serial-parallel converter comprising:

plural data extraction units for sequentially extracting bit values of serial data sequentially input thereto and for individually holding the bit values for a time period corresponding to a number of cycles of a clock signal equal to a number of said plural data extraction units;

a delay unit connected to said plural data extraction units for receiving data signals from said plural data extraction units and delaying the data signals to generate delay signals that are synchronized with each other;

a parallel register connected to said delay unit and receiving the delay signals therefrom for latching the delay signals to output the delay signals simultaneously as parallel data; and a trigger generator connected to each of said plural data extraction units for providing individual latch signals synchronously with the clock signal to said plural data extraction units, said trigger generator also being connected to said parallel register and providing a load signal thereto so that said parallel register fetches the delay signals on the basis of the load signal, said trigger generator comprising a shift register.

* * * * *